(12) United States Patent
Priore et al.

(10) Patent No.: US 9,300,293 B2
(45) Date of Patent: Mar. 29, 2016

(54) FAULT DETECTION FOR A DISTRIBUTED SIGNAL LINE

(71) Applicant: Advanced Micro Devices, Inc., Sunnyvale, CA (US)

(72) Inventors: Donald A. Priore, Groton, MA (US); John G. Petrovick, Jr., Hudson, MA (US); Stephen V. Kosonocky, Fort Collins, CO (US); Robert S. Orefice, Boston, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 291 days.

(21) Appl. No.: 13/894,014

(22) Filed: May 14, 2013

(65) Prior Publication Data
US 2014/0340114 A1 Nov. 20, 2014

(51) Int. Cl.
*H03K 19/00* (2006.01)
*G05F 1/10* (2006.01)
*G05F 3/02* (2006.01)
*H03K 19/003* (2006.01)

(52) U.S. Cl.
CPC .................................. *H03K 19/003* (2013.01)

(58) Field of Classification Search
USPC ....................................... 326/16–35; 327/544
See application file for complete search history.

(56) References Cited

U.S. PATENT DOCUMENTS

| | | | | |
|---|---|---|---|---|
| 8,729,923 | B2 * | 5/2014 | Ramachandra | 326/11 |
| 2003/0184364 | A1 * | 10/2003 | Miyagi | 327/544 |
| 2007/0176673 | A1 * | 8/2007 | Ito | 327/544 |
| 2009/0241073 | A1 * | 9/2009 | Ellavsky et al. | 716/2 |
| 2010/0097097 | A1 * | 4/2010 | Kim et al. | 326/34 |

* cited by examiner

*Primary Examiner* — Brandon S Cole

(57) ABSTRACT

An integrated circuit device includes a first signal line for distributing a first signal. The first signal line includes a plurality of branch lines, and a leaf node is defined at an end of each branch line. First logic is coupled to the leaf nodes and operable to generate a first status signal indicative of a collective first logic state of the leaf nodes of the signal line corresponding to the first signal.

23 Claims, 6 Drawing Sheets

FAULT DETECTION FOR A DISTRIBUTED SIGNAL LINE

FIELD OF THE DISCLOSURE

The present disclosure relates generally to processors and more particularly to detecting a fault in the distribution of a signal.

BACKGROUND

Multiple core processors include hierarchical power domains. Portions of the processor not needed to support a current level of activity are powered down, a technique referred to as power gating. The power domains are hierarchical in the respect that a sub-domain within a parent domain may be separately enabled or disabled while its parent domain is active.

This ability to selectively power gate components within domains or sub-domains in an integrated circuit device is particularly important in handheld devices including, but not limited to, cell phones, personal digital assistants, portable entertainment systems, etc. In such devices, reducing the net power consumption of the device lengthens the amount of time between charges (or between replacements) of a battery power source. However, it is recognized that the selective ability to switch components on or off in an integrated circuit device is also important to traditional computer systems that are not dependent upon a battery source. For instance, laptops are often designed to dissipate a low amount of heat so that the user is comfortable handling the system. It may further be valuable to selectively power gate components to reduce the net power consumed on a traditional computer system. It is further recognized that the physical size of an integrated circuit device and/or computer system, and the amount of operating noise associated with the device/system, may also decrease as the number and size of heat sinks and fans is reduced.

Power gating can cause frequent changes in the current supplied to the power domains. In integrated circuit, devices large currents can cause reliability problems over time. For example, copper used in various lines of the device can move due to electromigration, which may result in the generation of shorted or open circuits. To mitigate the change in current over time during power state changes, it is common to use multiple or cascaded power gating signals so that all of the power gating transistors that power a secondary or virtual power bus do not activate at the same time. The power gating signals are distributed in a tree-like fashion across the power domain they are controlling. Branch lines distribute the power enable line to one or more power gating transistors. In signal line arrangements that employ this distribution tree approach, one or more branch lines may have a fault, causing portions of the branch line to remain at a logic "1" or a logic "0". This type of fault is referred to as a "stuck-at fault," and the detection of such faults is complicated by the need to return every branch line to the original source for comparison with the enable signal. This difficulty is exacerbated when multiple enable signals are used to manage the power sequencing in a controlled fashion.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-7 illustrate example techniques for distributing power gating controls for hierarchical power domains and determining logic states of the signal line. Logic is used to combine logic states of leaf nodes of the signal line to generate a status signal representative of the collective logic state for the signal line.

Figure 1:
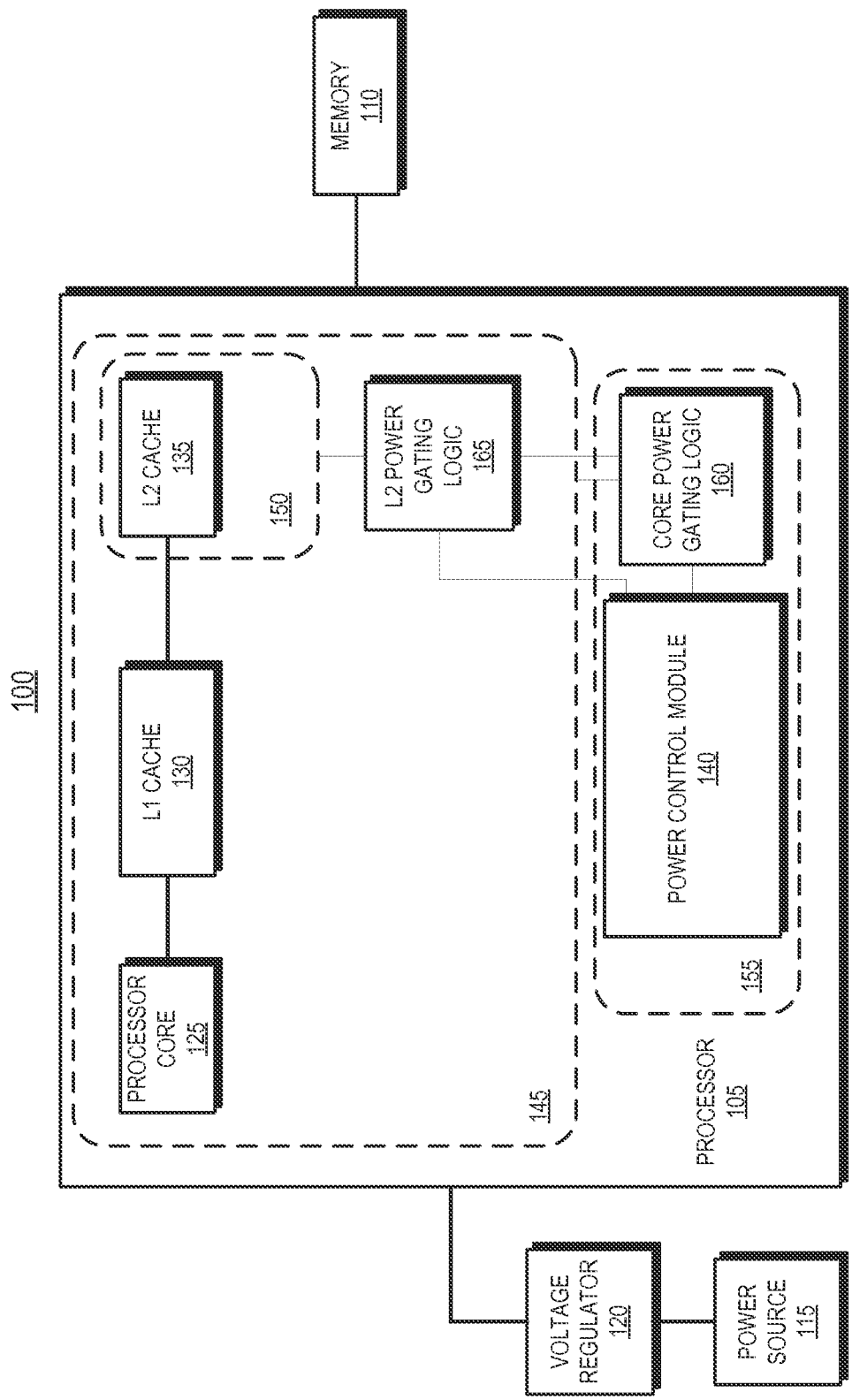
FIG. 1 is a block diagram of a processing system having a hierarchy of power domains in accordance with some embodiments.

FIG. 1 illustrates a processing system 100 having a hierarchy of power domains in accordance with some embodiments. The processing system 100 can be used in any of a variety of electronic devices, such as a personal computer, server, portable electronic device such as a cellular phone or smartphone, a game system, set-top box, and the like. The processing system 100 generally stores and executes instructions organized as computer programs in order to carry out tasks defined by the computer programs, such as data processing, communication with other electronic devices via a network, multimedia playback and recording, execution of computer applications, and the like.

The processing system 100 includes a processor 105, a memory 110, a power source 115, and a voltage regulator 120. The power source 115 can be any source that can provide electrical power, such as a battery, fuel cell, alternating current source (e.g. an electrical outlet or electrical generator), and the like. In some embodiments, the power source 115 also includes modules to regulate the form of the provided electrical power, such as modules to convert an alternating current to direct current. In either scenario, the power source 115 provides the electrical power via an output voltage. The voltage regulator 120 regulates the output voltage to provide a power supply voltage that it maintains with specified limits. The power supply voltage provides power to the processor 105, and can also provide power to other components of the processing system 100, such as the memory 110.

The memory 110 includes one or more storage devices that manipulate electrical energy in order to store and retrieve data. Accordingly, the memory 110 can be random access memory (RAM), hard disk drives, flash memory, and the like, or any combination thereof. The memory 110 is generally configured both to store the instructions to be executed by the processor 105 in the form of computer programs and to store the data that is manipulated by the executing instructions.

To facilitate the execution of instructions, the processor 105 includes at least one processor core 125. The processor core 125 includes one or more instruction pipelines to fetch, decode, dispatch, execute, and retire instructions. An operating system (OS) assigns the particular instructions to be executed by the processor core 125. To illustrate, a particular sequence of instructions to be executed by a processor core is referred to as a program thread. A thread can represent either an entire a computer program or a portion thereof assigned to carry out a particular task. For a computer program to be executed, the OS identifies the program threads of the computer program and assigns (schedules) the threads for execution at the processor core 125.

In the course of executing instructions, the processor core 125 stores and retrieves data from a memory hierarchy that includes the memory 110 and one or more caches, including a level 1 (L1) cache 130 and a level 2 cache 135. The levels of the caches 130, 135 indicate their relative its position in the memory hierarchy, with the L1 cache 130 representing the highest level, the L2 cache 135 the next-lower level, and the memory 110 representing the lowest level. In the illustrated example, the L1 and L2 caches 130, 135 are associated with the single processor core 125. In some embodiments, the processor 105 may include multiple processor cores, and one or more caches may be shared by the multiple cores. For example, the L2 cache 135 may be shared by one or more cores, such that the L2 cache 135 can store and retrieve data on behalf of any of the processor cores.

The memory hierarchy is configured to store data in a hierarchical fashion, such that the lowest level (the memory 110) stores all system data, and other levels store a subset of the system data. The processor core 125 accesses (i.e., reads or writes) data in the memory hierarchy via memory access operations, whereby each memory access operation indicates a memory address of the data to be accessed. In the event that a particular level of the memory hierarchy does not store data associated with the memory address of a received memory access, it requests the data from the next-lower level of the memory hierarchy. In this fashion, data traverses the memory hierarchy, such that the L1 cache 130 stores the data most recently requested by the processor core 125.

In some operating situations, the processor core 125 may not have any processing tasks to complete. Accordingly, to conserve power, the processing system 100 includes a power control module 140 that controls the power supplied individually to various power domains in the processor 105 so that idle components may be powered down. The power control module 140 selectively couples and decouples the voltage supplied by the voltage regulator 120 to the various power domains. Exemplary power domains include a core power domain 145, a L2 cache power domain 150, and an always-on domain 155. An always-on domain is one that is not selectively power gated. This domain retains power at any time the system is powered on, even if some or most of the system components are in a sleep state. The components disposed in the always on-domain are ones that are required to control the sleep states of the other domains. The power control module 140 is located within the always-on domain 155 to provide signals to control the power states of the other power domains 145, 150. The hierarchy of power domains may vary depending on the particular architecture of the processor 105. For example, a multi-core processor may have separate power domains for each core and its associated L1 cache, and a separate power domain for a shared L2 cache. The L2 cache may be power gated if all of its associated cores are also power gated.

The processor core 125 may be power gated depending on the processing demands on the processor 105. In some embodiments, the L1 and L2 caches 130, 135 are part of the core power domain 145, so if the processor core 125 is power gated, so too are its associated L1 and L2 caches 130, 135. Prior to power gating the core power domain 145, the contents of the associated caches 130, 135 are flushed to the memory 110. In some situations, if the processing load is light, the processor core 125 may remain operational, but the L2 cache 135 may be power gated to conserve power. The L1 cache 130 may then be the only cache operating for the processor core 125. The L2 cache power domain 150 is a sub-domain of the core power domain 145, as it may be selectively power gated while the core power domain 145 is operational, but is power gated if the parent domain is power gated.

The power control module 140 sends signals to core power gating logic 160 (e.g., control logic) to generate a core virtual voltage generated for the core power domain 145 and to L2 power gating logic 165 (e.g., control logic) to generate a L2 cache virtual voltage for the L2 cache power domain 150. The power control module 140 may control the L2 power gating logic 165 directly or through the core power gating logic 160.

Figure 2:
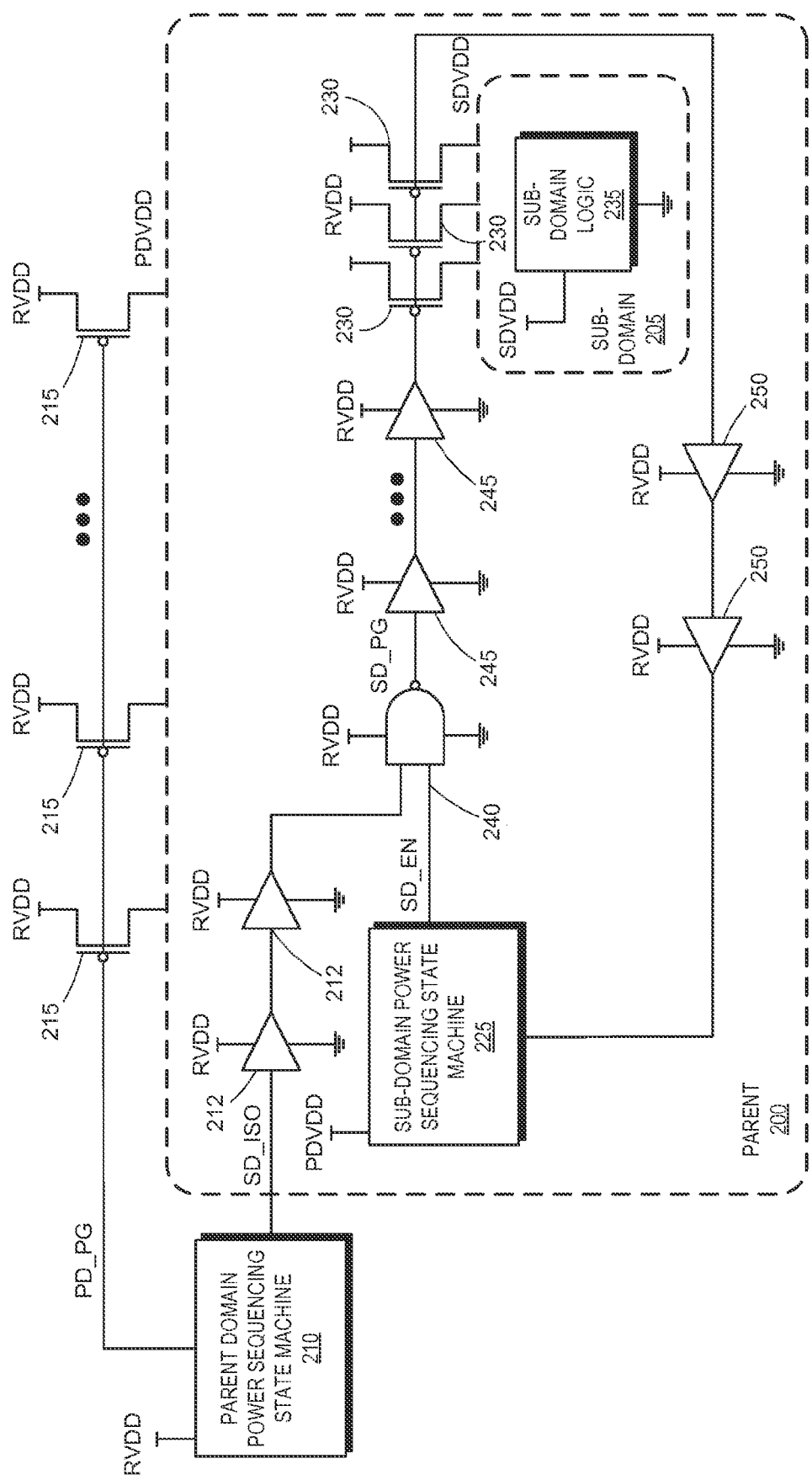
FIG. 2 is a block diagram illustrating how power gating is implemented for a parent domain and a sub-domain in the hierarchy of power domains in accordance with some embodiments.

FIG. 2 is a block diagram illustrating how power gating is implemented for a parent power domain 200 and a sub-domain 205 in the hierarchy of power domains in accordance with some embodiments. In the illustrated example, the parent power domain 200 may be the core power domain 145 and the sub-domain 205 may be the L2 cache power domain 150. In some embodiments, the parent domain may be a sub-domain of a higher level domain in the hierarchy. For example, an L2 cache may have different sections that can be separately power gated to change the size of the L2 cache according to the demands placed on it. A portion of the L2 cache may be a sub-domain of the overall L2 cache parent domain, while the L2 cache may itself be a sub-domain of the core power domain 14S.

A parent domain power sequencing state machine 210 (e.g., the core power gating logic 160) controls a plurality of power gating transistors 215 for generating a virtual power supply voltage, PDVDD, for the parent power domain 200. A virtual power supply voltage refers to a secondary power supply voltage that is generated from the output of the voltage regulator 120 to power a power domain or sub-domain. The always-on domain 155 is powered by the voltage regulator 120 without intervening power gating transistors. The power supply voltage for always-on domain 155 may be referred to as a real power supply voltage, while the power supplies generated by power gating transistors are referred to as virtual power supply voltages. The parent domain power sequencing state machine 210 and the power gating transistors 215 are disposed in the always-on domain 220 to ensure reliable control signals to avoid unintentional powering of components in the parent power domain 200, thereby causing leakage. To reduce the magnitude of the current fluctuation and to reduce noise, the parent domain power sequencing state machine 210 may stagger the enablement of the power gating transistors 215 using a cascaded enable signal or multiple enable signals.

A sub-domain power sequencing state machine 225 performs a similar function for the sub-domain power domain 205 by selectively enabling power gating transistors 230 to generate a virtual sub-domain voltage, SDVDD, for powering sub-domain logic 235. The sub-domain power sequencing state machine 225 is located in the parent power domain 200, such that when the parent power domain 200 is power gated by the parent domain power sequencing state machine 210, the sub-domain power sequencing state machine 225 cannot generate logic signals for preventing the unintentional enabling of the power gating transistors 230 and causing leakage in the sub-domain logic 235.

To prevent unintentional enabling of the power gating transistors 230, the parent domain power sequencing state machine 210 generates a first sub-domain enable signal (SD_ISO—isolate low, enable high) that is propagated through buffers 212 and logically combined with a second sub-domain enable signal (SD_EN—enable high) from the sub-domain power sequencing state machine 225 in a logic gate 240. Thus, if the enable signal is removed by either the parent domain power sequencing state machine 210 or the sub-domain power sequencing state machine 225, the power gating transistors 230 are maintained in an off state. Buffers 245 propagate the combined enable signal, SD_PG, from the logic gate 240 to the power gating transistors 230. The logic gate 240 and the buffers 245 are powered by the RVDD voltage from the always-on domain 220, so the power state is always affirmatively controlled. Return buffers 250 return the enable signal to the sub-domain power sequencing state machine 225 so that it may receive feedback regarding the power state of the sub-domain power domain 205.

When the parent power domain 200 is powered, the sub-domain power sequencing state machine 225 controls the state of the sub-domain power domain 205. It power gates the sub-domain power domain 205 by removing its enable signal from the logic gate 240. If the parent power domain 200 is subsequently power gated, the parent domain power sequencing state machine 210 removes its enable signal from the logic gate 240 when disabling the power gating transistors 215 and removing the PDVDD supply. In this manner, the signal that isolates the power gating transistors 230 is maintained while the sub-domain power sequencing state machine 225 is powered down and unable to control the power gating transistors 230.

Figure 3:
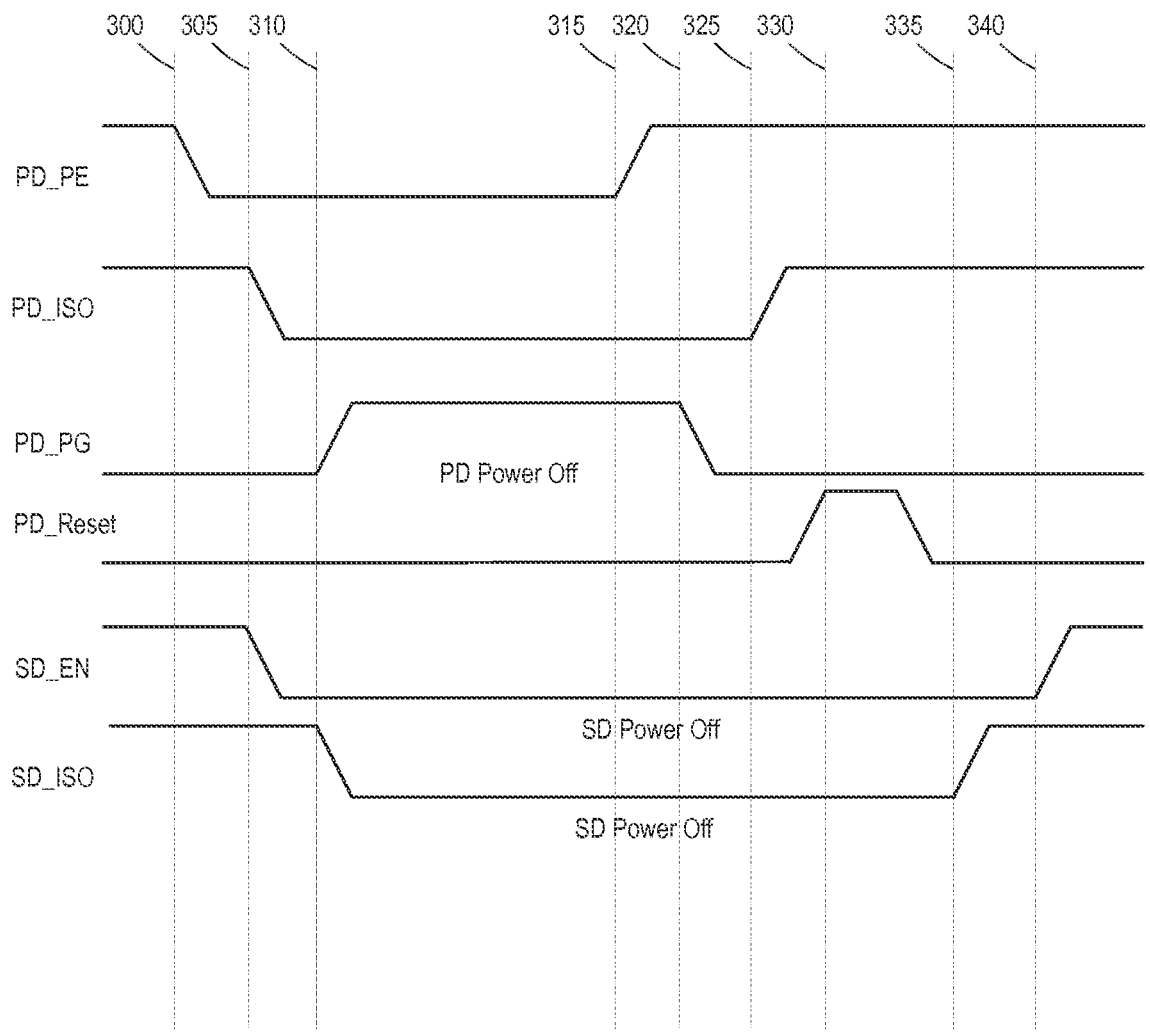
FIG. 3 is a timing diagram illustrating the control signals for implementing power gating in the circuit of FIG. 2 in accordance with some embodiments.

FIG. 3 is a timing diagram illustrating the transitioning of the power domains 200, 205. A parent domain enable signal, PD_PE, represents the desired power state of the parent power domain 200. For example, the power control module 140 may generate the PD_PE signal to indicate the desired power status of the core power domain 145. The PD_PE signal is de-asserted at event 300 to indicate a transition to a steep state. A parent domain isolation signal, PD_ISO, is asserted when the outputs of the parent domain are valid and de-asserted when they are not valid. For example, the power control module 140 may de-assert the PD_ISO signal at event 305 so that other entities in the system do not rely on the logic values of the outputs of the core 125 during the power transition.

A parent domain power gate signal, PD_PG, is generated by the parent domain power sequencing state machine 210 to control the power gating transistors 215 that generate the parent domain virtual voltage, PDVDD. The PD_PG signal is de-asserted at event 310 to power down the PDVDD supply. The sub-domain power sequencing state machine 225 de-asserts the SD_EN signal at event 305 to de-assert the SD_PG signal controlling the power gating transistors 230 responsive to the removal of the PD_PE signal at event 300. The parent domain power sequencing state machine 210 generates the SD_ISO signal at event 310 to ensure that the SD_PG signal remains de-asserted while the parent domain is power gated.

The PD_PE signal is re-established at event 315 to begin the transition of the parent power domain 200 out of the power gated state. The PD_PG signal is asserted at event 320 by the parent domain power sequencing state machine 210 to restore power to the parent power domain 200. The PD_ISO signal is removed at event 325 and a parent domain reset signal, PD_Reset, is generated at event 330 to reset the logic of the parent domain. Following the reset, the parent domain power sequencing state machine 210 de-asserts the SD_ISO signal at event 335, and the sub-domain power sequencing state machine 225 asserts the SD_EN signal at event 340 to restore power to the sub-domain domain 205 and provide the virtual power supply, SDVDD, for the sub-domain logic 215.

Because the sub-domain power sequencing state machine 225 is located in the parent power domain 200 the overall power consumption is reduced because the sub-domain power sequencing state machine 225 can be powered down with the parent power domain 200. The sub-domain power sequencing state machine 225 controls the state of the SD_PG signal while the parent power domain 200 is powered up using the SD_EN signal, and the parent domain power sequencing state machine 210 controls the state of the SD_PG signal via the SD_ISO signal when the parent power domain 200 is power gated. Thus, the power gating state of the sub-domain domain 205 is controlled to avoid leakage during power transitions.

Although the path for enabling the power gating transistors 230 is illustrated in FIG. 2 as being a single line, in some embodiments, the enable signal for the power gating transistors 230 will have a tree topology, where the signal line includes multiple signal lines from which branch lines will feed various power gating transistors 230. In some other embodiments, multiple enable lines may be used. The use of multiple segments and/or multiple enable lines allows the power gating transistors 230 to be enabled in a staggered fashion, so that the change in current, di/dt, may be reduced as compared to what would be present if all power gating transistors 230 for generating the virtual power supply, SDVDD, were to be concurrently enabled.

Figure 4:
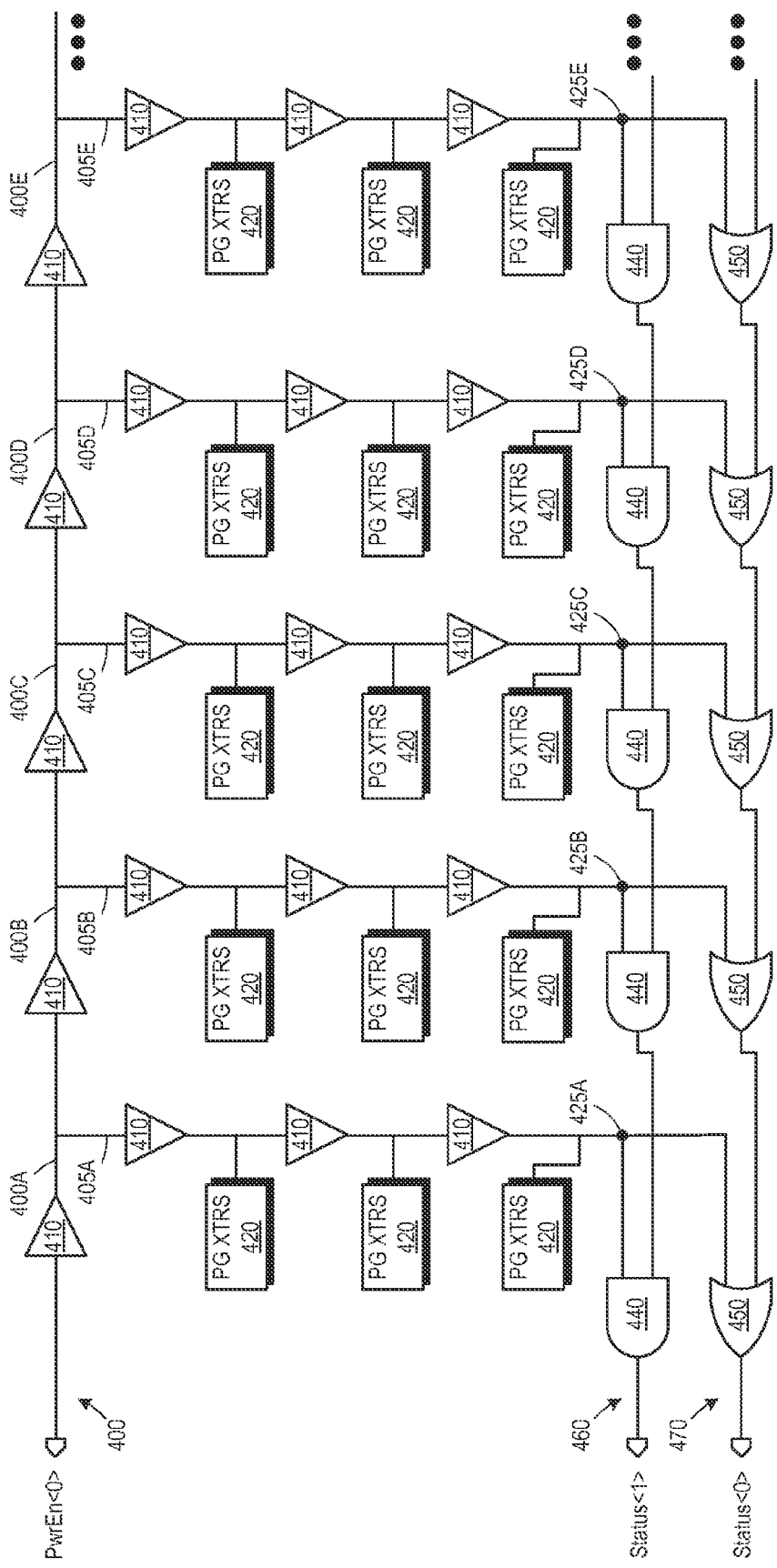
FIG. 4 is a block diagram illustrating the distribution and status monitoring of a power enable signal line in accordance with some embodiments.

FIG. 4 is a block diagram illustrating the distribution and status monitoring of a power enable signal line 400 in accordance with some embodiments. In the context of FIG. 2, the power enable signal line 400 may be the line transmitting the PG_PG for enabling the power gating transistors 215, or the line transmitting the SD_PG signal for enabling the power gating transistors 230. The signal line 400 includes a plurality of trunk segments 400A-E, separated by buffers 410. The buffers 410 serve to maintain the integrity of the power enable signal transmitted on the signal line as it traverses the integrated circuit device. Each trunk segment 400A-E may distribute a power enable signal, (PwrEn), such as the SD_PG signal of FIG. 2, to a branch line 405A-E of the signal line 400. The branch lines 405A-E also have segments separated by buffers 410 to maintain signal integrity. The branch lines 405A-E distribute the PwrEn signal to one or more power gating transistors 420. Although not illustrated, power gating transistors 420 may also be controlled directly from one of the trunk segments 400A-E. Due to the buffers 410 provided between the segments 400A-E, the PwrEn signal is delayed as it traverses the signal line 400. Thus, the enabling of the power gating transistors 420 may be cascaded. In some embodiments, additional delay elements may be provided along the signal line 410 to control the timing of the enabling of the power gating transistors 420. The end segments of each branch line 405A-E may be referred to as leaf nodes 425A-E, as they represent the end of each branch line 405A-E.

To perform fault detection of the power gating functions, the logic states of the leaf nodes 425A-E may be determined. If the logic state of each leaf node 425A-E matches the expected state of the power enable signal then there is no fault likely to be present, since the logic state is transmitted by the buffers 410 from the trunk segments 400A-E, through all of the segments of the branch lines 405A-E to the leaf nodes 425A-E. Collective status information is determined for the leaf nodes 425A-E of the branch lines 405A-E using logic gates, such as an AND gate 440 and/or an OR gate 450. The output of the AND gate 440, Status<1> on status line 460, is high when the signal at each monitored leaf node 425A-E is also high and low if any leaf node 425A-E is low. A fault that results in a stuck low condition of one of the leaf nodes 425A-E can be detected by a low output form the AND gate 440 when the power enable signal is expected to be high. Conversely, the output of the OR gate 450, Status<0>, on status line 470 is low when the signal at each monitored leaf node 425A-E is also low and high if any of the leaf nodes 425A-E is high. A fault that results in a stuck high condition of one of the leaf nodes 425A-E can be detected by a high output from the OR gate 450 when the power enable signal is expected to be low.

In the context of the power enable signal, PwrEn, that is asserted low to enable the power gating transistors 420 and de-asserted high to disable the power gating transistors 420, the status signal, Status<1> provides an indication that the signal line 400 is in a de-asserted state, and the status signal, Status<0> provides an indication that the signal line 400 is in an asserted state. The two status lines 460, 470 provide complimentary status signals of the logical state of the signal line 400. Although the feedback path to the sub-domain power sequencing state machine 225 is illustrated as being an extension of the signal line in FIG. 2, it is contemplated that the feedback may be provided by one or both of the status lines 460, 470. The status signals illustrated in FIG. 4 may also be generated for the signal line carrying the PD_PG signal for the parent domain 200, and the status feedback may be provided to the parent domain power sequencing state machine 210. Stuck at faults in one of the segments 400A-E or branch lines 405A-E may be determined based on the status signals. If the detected status indicated by Status<0> and/or Status<1> does not correspond to the expected status, a fault is likely to be present.

Figure 5:
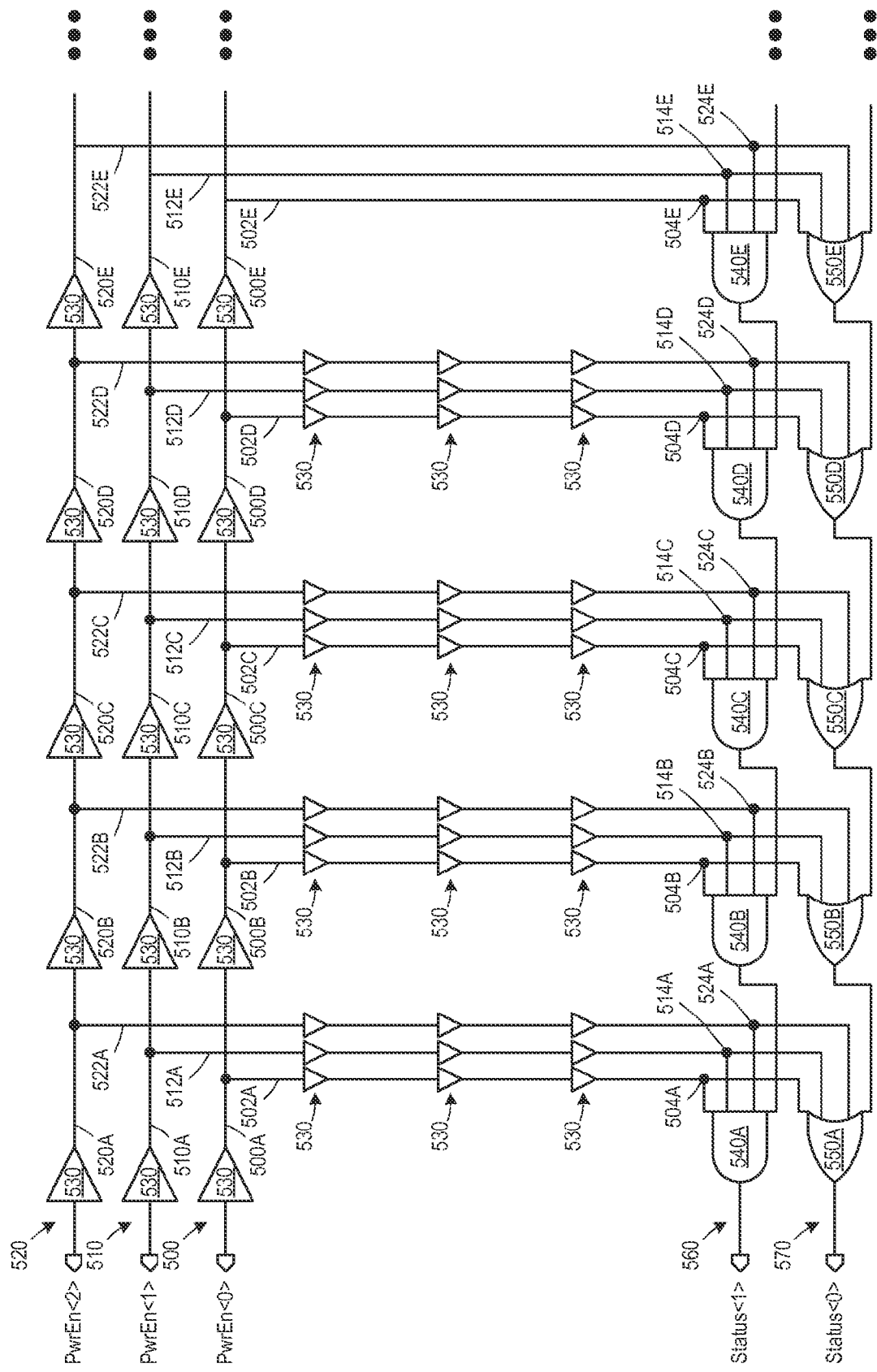
FIG. 5 is a block diagram illustrating the distribution and status monitoring of a distribution tree including multiple power enable signal lines in accordance with some embodiments.

FIG. 5 is a block diagram illustrating the distribution and status monitoring of a distribution tree including multiple power enable signal lines 500, 510, 520 in accordance with some embodiments. In the context of FIG. 2, the power enable signal lines 500, 510, 520 may be represented collectively by the line transmitting the PG_PG signal for enabling the power gating transistors 215, or the line transmitting the SD_PG signal for enabling the power gating transistors 230. Multiple enable signals (PwrEn<0>, PwrEn<1, and PwrEn<2>) are provided to provide increased controllability for the enabling of the power gating transistors to limit current transients. The power enable signals on each line 500, 510, 520 may be provided at different times to decrease transient current. Each signal line 500, 510, 520 includes multiple trunk segments, 500A-E, 510A-E, and 520A-E, respectively. The trunk segments 500A-E, 510A-E, and 520A-E are divided by buffers 530. Each trunk segment 500A-E may distribute a power enable signal, (PwrEn), such as the SD_PG signal of FIG. 2, to a branch line 502A-E, 512A-E, 522A-E of the signal line 500. The branch lines 502A-E, 512A-E, 522A-E also have segments separated, by buffers 530 to maintain signal integrity. The end segments of each branch line 502A-E, 512A-E, 522A-E may be referred to as leaf nodes 504A-E, 514A-E, 524A-E. The branch lines 502A-E, 512A-E, 522A-E distribute the PwrEn signal to one or more power gating transistors, which for ease of illustration, are omitted.

Collective status information is determined for the signal lines 500, 510, 520 using logic gates, such as AND gates 540A-E and/or OR gates 550A-E. The output of the AND gate 540A, Status<1> on status line 560, is high when the signal at each monitored leaf node 504A-E, 514A-E, 524A-E of each monitored signal line 500, 510, 520 is also high. Conversely, the output of the OR gate 550A, Status<0>, on status line 570 is low when the signal at each monitored leaf node 504A-E, 514A-E, 524A-E of each monitored signal line 500, 510, 520 is also low. The output the logic gates 540A-E, 550A-E are interleaved so that the logic state propagates through to the status lines 560, 570. For example, the output of the logic gates 540E, 550E are coupled to the inputs of the logic gate 540D, 550D that are next in the chain, so that the output of the logic gates 540D, 550D represent the collective status of the leaf nodes 504D-E, 514D-E, 524D-E. In the context of the power enable signals, PwrEn<0-2>, that are asserted low to enable power gating transistors and de-asserted high to disable power gating transistors, the status signal, Status<1> provides an indication that the signal lines 500, 510, 520 are in a de-asserted state, and the status signal, Status<0> provides an indication that the signal lines 500, 510, 520 are in an asserted state. The two status lines 560, 570 provide complimentary status signals of the logical state of the lines 500, 510, 520. Again, the feedback to the sub-domain power sequencing state machine 225 may be provided by the status lines 560, 570. The status signals illustrated in FIG. 5 may also be generated for the signal line carrying the PD_PG signal for the parent domain 200, and the status feedback may be provided to the parent domain power sequencing state machine 210.

If the logic state of any of the leaf nodes 504A-E, 514A-E, 524A-E of any of the signal lines 500, 510, 520 does not match the expected state, a fault may be present. As described above in reference to FIG. 4, a stuck at low fault may be identified if the Status<1> signal is low when the expected state is high, and a stuck at high state may be identified if the Status<0> signal is high when the expected state is low.

Although the signal lines 400, 500, 510, 520 are illustrated as distributing power enable signals to drive power gating transistors 420, the concepts described herein may be applied to any logic signal that is distributed in a tree fashion to various end devices.

Figure 6:
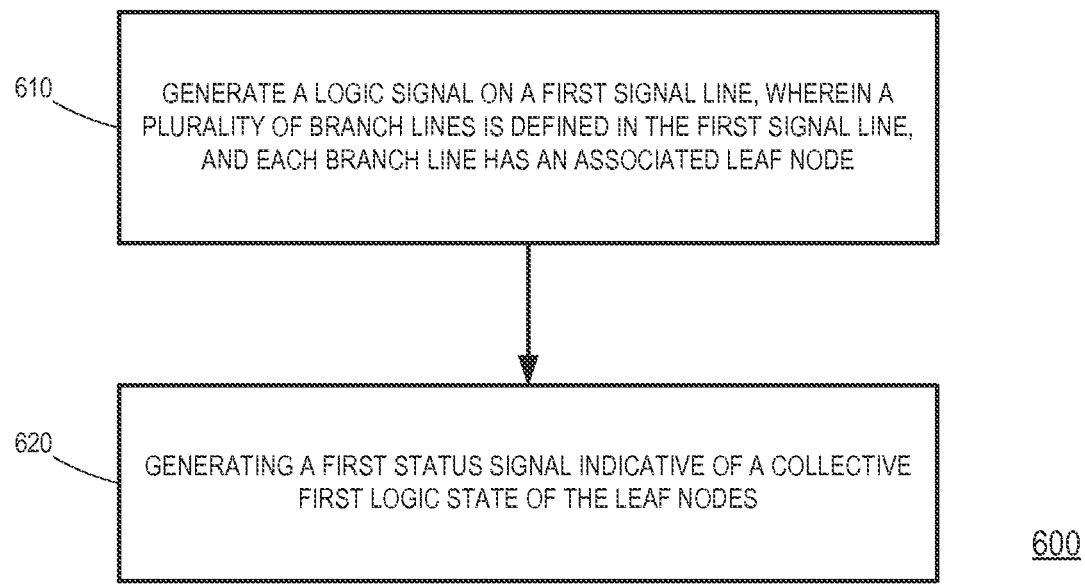
FIG. 6 is a simplified flow diagram of a method for determining a logic state status of a signal line in accordance with some embodiments.

FIG. 6 is a simplified flow diagram of a method 600 for determining a logic state status of a signal line. In method block 610, a logic signal is generated on a first signal line. A plurality of branch lines is defined in the first signal line, and each branch line has an associated leaf node. In method block 620, a first status signal is generated indicative of a collective first logic state of the leaf nodes.

In some embodiments, the apparatus and techniques described above are implemented in a system comprising one or more integrated circuit (IC) devices (also referred to as integrated circuit packages or microchips), such as the processor described above with reference to FIGS. 1-6. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 7:
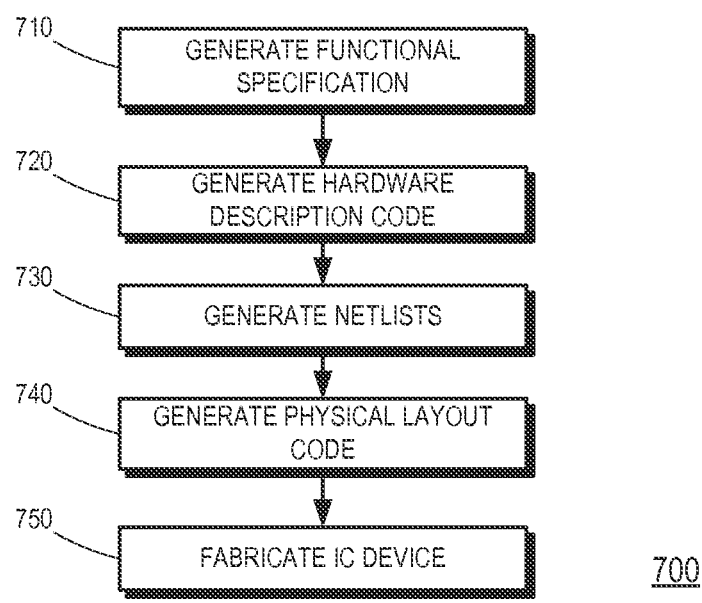
FIG. 7 is a flow diagram illustrating an example method for the design and fabrication of an IC device implementing one or more aspects in accordance with some embodiments.

FIG. 7 is a flow diagram illustrating an example method 700 for the design and fabrication of an IC device implementing one or more aspects in accordance with some embodiments. As noted above, the code generated for each of the following processes is stored or otherwise embodied in computer readable storage media for access and use by the corresponding design tool or fabrication tool.

At block 710 a functional specification for the IC device is generated. The functional specification (often referred to as a micro architecture specification (MAS)) may be represented by any of a variety of programming languages or modeling languages, including C, C++, SystemC, Simulink, or MATLAB.

At block 720, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, a synthesis tool is used to synthesize the hardware description code to generate code representing or defining an initial physical implementation of the circuitry of the IC device at block 730. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 740, one or more EDA tools use the netlists produced at block 730 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 750, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

According to some embodiments, an integrated circuit device includes a first signal line for distributing a first signal. The first signal line includes a plurality of branch lines, and a leaf node is defined at an end of each branch line. First logic is coupled to the leaf nodes and operable to generate a first status signal indicative of a collective first logic state of the leaf nodes of the signal line corresponding to the first signal.

According to some embodiments, a processor includes a first module disposed within a first power domain. A plurality of power gating transistors generate a first virtual power supply for the first power domain to power the first module responsive to an enable signal. Control logic is operable to generate the enable signal. A first signal line is coupled to the control logic. The signal line includes a plurality of branch lines coupled to selected ones of the plurality of power gating transistors to distribute the enable signal, wherein each branch line has an associated leaf node. First logic is coupled to the leaf nodes and the control logic. The first logic is operable to generate a first status signal indicative of a collective first logic state of the leaf nodes.

According to some embodiments, a method includes generating a logic signal on a first signal line. A plurality of branch lines is defined in the first signal line, and each branch line has an associated leaf node. A first status signal indicative of a collective first logic state of the leaf nodes is generated.

According to some embodiments a non-transitory computer readable medium stores code to adapt at least one computer system to perform a portion of a process to fabricate at least part of an integrated circuit device. The device includes a first signal line for distributing a first signal. The first signal line includes a plurality of branch lines, and a leaf node is defined at an end of each branch line. First logic is coupled to the leaf nodes and operable to generate a first status signal indicative of a collective first logic state of the leaf nodes of the signal line corresponding to the first signal.

In some embodiments, certain aspects of the techniques described above may implemented by one or more processors of a processing system executing software. The software comprises one or more sets of executable instructions stored on a computer readable medium that, when executed by the one or more processors, manipulate the one or more processors to perform one or more aspects of the techniques described above. The software is stored or otherwise tangibly embodied on a computer readable storage medium accessible to the processing system, and can include the instructions and certain data utilized during the execution of the instructions to perform the corresponding aspects.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit device, comprising:
   a signal line for distributing a signal, wherein the signal line comprises a plurality of branch lines, each of the branch lines having a leaf node at an end of the branch line;
   first logic coupled to the leaf nodes of the plurality of branch lines and operable to generate a first status signal indicative of whether all of the leaf nodes of the plurality of branch lines have a first logic state corresponding to the signal; and
   wherein the signal line comprises one of a plurality of signal lines, each having a plurality of branch lines with associated leaf nodes, and the first logic is coupled to the leaf nodes of each of the branch lines of all of the plurality of signal lines and is operable to logically combine logic states of all of the leaf nodes of all of the signal lines to generate the first status signal.

2. The device of claim 1, further comprising second logic coupled to the leaf nodes of the plurality of branch lines and operable to generate a second status signal indicative of whether all of the leaf nodes of the plurality of branch lines have a second logic state corresponding to the signal, wherein the first logic state comprises an asserted logic state and the second logic state comprises a de-asserted logic state.

3. The device of claim 2, wherein the first logic further comprises a first logic gate coupled to the leaf nodes and operable to generate the first status signal, and the second logic comprises a second logic gate coupled to the leaf nodes.

4. The device of claim 1, wherein the first logic comprises a plurality of interleaved logic gates, each logic gate having inputs coupled to one leaf node from each of the plurality of signal lines and an input coupled to an output of a different one of the logic gates.

5. The device of claim 1, further comprising second logic coupled to the leaf nodes of each of the branch lines and operable to logically combine logic states of all of the leaf nodes of all of the branch lines to generate a second status signal indicative of a second logic state of the leaf nodes, wherein the first logic state comprises an asserted logic state and the second logic state comprises a de-asserted logic state.

6. The device of claim 5, wherein the first logic comprises a first plurality of logic gates, each of the first plurality of logic gates having inputs coupled to one leaf node from each of the plurality of signal lines and an input coupled to an output of a different one of the first plurality of logic gates, and the second logic comprises a second plurality of logic gates, each of the second plurality of logic gates having inputs coupled to one leaf node from each of the plurality of signal lines and an input coupled to an output of a different one of the second plurality of logic gates.

7. The device of claim 1, further comprising control logic operable to generate an enable signal on the signal line and coupled to the first logic to receive the first status signal on the signal line and compare the first status signal to the enable signal to identify a fault condition for the signal line.

8. A processor, comprising:
   a module disposed within a power domain;
   a plurality of power gating transistors for generating a virtual power supply for the power domain to power the module responsive to an enable signal;
   control logic operable to generate the enable signal;
   a signal line coupled to the control logic and including a plurality of branch lines coupled to selected ones of the plurality of power gating transistors to distribute the enable signal, wherein each branch line has an associated leaf node; and
   first logic coupled to the leaf nodes of the plurality of branch lines and the control logic, the first logic being operable to generate a first status signal indicative of a collective first logic state of the leaf nodes.

9. The processor of claim 8, wherein the module comprises a processor core.

10. The processor of claim 8, wherein the module comprises a cache memory.

11. The processor of claim 8, further comprising second logic coupled to the leaf nodes and operable to generate a second status signal indicative of a collective second logic state of the leaf nodes, wherein the first logic state comprises an asserted logic state and the second logic state comprises a de-asserted logic state.

12. The processor of claim 11, wherein the first logic further comprises a first logic gate coupled to the leaf nodes and operable to generate the first status signal, and the second logic comprises a second logic gate coupled to the leaf nodes.

13. The processor of claim 8, wherein the signal line comprises one of a plurality of signal lines, each having a plurality of branch lines and associated leaf nodes, and the first logic is coupled to the leaf nodes of each of the signal lines operable to logically combine logic states of all of the leaf nodes of all of the signal lines to generate the first status signal.

14. The processor of claim 13, wherein the first logic comprises a plurality of interleaved logic gates, each logic gate having inputs coupled to one leaf nodes from each of the plurality of branch lines and an input coupled to an output of a different one of the logic gates.

15. The processor of claim 13, further comprising second logic coupled to the leaf nodes of each of the branch lines and operable to logically combine logic states of all of the leaf nodes of all of the branch lines to generate a second status signal indicative of a second logic state of the leaf nodes, wherein the first logic state comprises an asserted logic state and the second logic state comprises a de-asserted logic state.

16. The processor of claim 15, wherein the first logic comprises a first plurality of logic gates, each of the first plurality of logic gates having inputs coupled to one leaf node from each of the plurality of signal lines and an input coupled to an output of a different one of the first plurality of logic gates, and the second logic comprises a second plurality of logic gates, each of the second plurality of logic gates having inputs coupled to one leaf node from each of the plurality of signal lines and an input coupled to an output of a different one of the second plurality of logic gates.

17. The processor of claim 8, wherein the control logic is operable to compare the first status signal to the enable signal to identify a fault condition for the signal line.

18. A method, comprising:
generating a logic signal on a signal line, wherein the signal line comprises one of a plurality of signal lines, each signal line having a plurality of branch lines and associated leaf nodes and wherein each plurality of branch lines is defined in the signal line, and each branch line has an associated leaf node; and
generating a first status signal indicative of whether all of the leaf nodes of the plurality of branch lines have a first logic state corresponding to the logic signal, wherein generating the first status signal comprises logically combining logic states of all of the leaf nodes of all the branch lines of all of the plurality of signal lines to generate the first status signal.

19. The method of claim 18, further comprising generating a second status signal indicative of whether all of the leaf nodes have a second logic state corresponding to the logic signal, wherein the first logic state comprises an asserted logic state and the second logic state comprises a de-asserted logic state.

20. The method of claim 18, further comprising generating a second status signal indicative of a second logic state of the leaf nodes of all of the branch lines of all of the signal lines, wherein the first logic state comprises an asserted logic state and the second logic state comprises a de-asserted logic state.

21. The method of claim 18, further comprising comparing the first status signal to the logic signal to identify a fault condition for the signal line.

22. The processor of claim 8, wherein the collective first logic state is indicative of all of the leaf nodes of the plurality of branch lines having the same logic state.

23. An integrated circuit device, comprising:
a signal line for distributing a signal, wherein the signal line comprises a plurality of branch lines, each of the branch lines having a leaf node at an end of the branch line;
logic coupled to the leaf nodes of the plurality of branch lines and operable to generate a status signal indicative of whether all of the leaf nodes of the plurality of branch lines have a specified logic state corresponding to the signal; and
control logic operable to generate an enable signal on the signal line and to receive the status signal on the signal line and compare the status signal to the enable signal to identify a fault condition for the signal line.

* * * * *